United States Patent
Schoenfeld et al.

(10) Patent No.: US 6,707,096 B2
(45) Date of Patent: Mar. 16, 2004

(54) FORK-LIKE MEMORY STRUCTURE FOR ULSI DRAM AND METHOD OF FABRICATION

(75) Inventors: Aaron Schoenfeld, Boise, ID (US); Manny Kin F. Ma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/038,635

(22) Filed: Jan. 3, 2002

(65) Prior Publication Data

US 2002/0056867 A1 May 16, 2002

Related U.S. Application Data

(60) Continuation of application No. 09/233,820, filed on Jan. 20, 1999, which is a division of application No. 08/759,464, filed on Dec. 5, 1996, now Pat. No. 6,010,932.

(51) Int. Cl.$^7$ .............................................. H01L 27/108
(52) U.S. Cl. ..................... 257/309; 257/298; 257/300; 257/303; 257/304; 257/305; 257/308; 257/309
(58) Field of Search ................................ 257/298, 300, 257/303, 304, 305, 308

(56) References Cited

U.S. PATENT DOCUMENTS

| | | | |
|---|---|---|---|
| 5,061,650 A | 10/1991 | Dennison et al. | |
| 5,084,405 A | 1/1992 | Fazan et al. | |
| 5,158,905 A | * 10/1992 | Ahn | 437/52 |
| 5,164,881 A | * 11/1992 | Ahn | 361/313 |
| 5,256,587 A | * 10/1993 | Jun et al. | 437/52 |
| 5,274,258 A | * 12/1993 | Ahn | 257/308 |
| 5,292,677 A | 3/1994 | Dennison | |
| 5,338,700 A | 8/1994 | Dennison et al. | |
| 5,340,763 A | 8/1994 | Dennison | |
| 5,340,765 A | 8/1994 | Dennison et al. | |
| 5,358,888 A | * 10/1994 | Ahn et al. | 437/52 |
| 5,362,666 A | 11/1994 | Dennison | |
| 5,429,980 A | 7/1995 | Yang et al. | |
| 5,438,013 A | 8/1995 | Kim et al. | |
| 5,447,878 A | * 9/1995 | Park et al. | 437/52 |
| 5,457,063 A | 10/1995 | Park | |
| 5,459,094 A | 10/1995 | Jun | |
| 5,459,095 A | 10/1995 | Huang et al. | |
| 5,491,356 A | 2/1996 | Dennison et al. | |
| 5,494,841 A | 2/1996 | Dennison et al. | |
| 5,508,223 A | 4/1996 | Tseng | |
| 5,733,808 A | 3/1998 | Tseng | |
| 5,744,833 A | * 4/1998 | Chao | 257/308 |
| 5,889,301 A | * 3/1999 | Tseng | 257/308 |
| 5,959,319 A | 9/1999 | Iwasa | |
| 5,959,326 A | 9/1999 | Aiso et al. | |
| 5,994,197 A | 11/1999 | Liao | |
| 5,994,730 A | 11/1999 | Shrivastava et al. | |
| 6,022,776 A | 2/2000 | Lien et al. | |
| 6,063,656 A | 5/2000 | Clampitt | |
| 6,069,379 A | 5/2000 | Kimura et al. | |
| 6,072,210 A | 6/2000 | Choi | |
| 6,078,093 A | 6/2000 | Lee | |
| 6,097,053 A | 8/2000 | Ando | |
| 6,137,131 A | 10/2000 | Wu | |
| 6,232,628 B1 | * 5/2001 | Shirosaki et al. | 257/306 |

FOREIGN PATENT DOCUMENTS

| | | |
|---|---|---|
| JP | 405275615 | 1/1994 |
| JP | 406005806 | 1/1994 |
| JP | 06-169068 | 6/1994 |
| JP | 07-014931 | 1/1995 |
| JP | 10-065122 | 3/1998 |

* cited by examiner

Primary Examiner—George Eckert
Assistant Examiner—Edgardo Ortiz
(74) Attorney, Agent, or Firm—TraskBritt

(57) ABSTRACT

A masking and etching technique during the formation of a memory cell capacitor which simultaneously separates storage poly into individual storage poly nodes and etches recesses into the storage poly nodes which increase the surface area of the storage poly nodes and thereby increase the capacitance of a completed memory cell without additional processing steps.

24 Claims, 5 Drawing Sheets

FORK-LIKE MEMORY STRUCTURE FOR ULSI DRAM AND METHOD OF FABRICATION

CROSS REFERENCE TO RELATED APPLICATIONS

This application is a continuation of application Ser. No. 09/233,820, filed Jan. 20, 1999, pending, which is a divisional of application Ser. No. 08/759,464, filed Dec. 5, 1996, now U.S. Pat. No. 6,010,932, issued Jan. 4, 2000.

BACKGROUND OF THE INVENTION

1. Field of the Invention

The present invention relates to a memory cell or storage capacitor and method for forming the memory cell capacitor. More particularly, the present invention relates to a one-step masking and etching technique which simultaneously separates storage poly into individual storage poly nodes and etches recesses into the storage poly node to increase the surface area of the storage poly node.

2. State of the Art

A widely-utilized DRAM (Dynamic Random Access Memory) manufacturing process utilizes CMOS (Complimentary Metal Oxide Semiconductor) technology to produce DRAM circuits which comprise an array of unit memory cells, each including one capacitor and one transistor, such as a field effect transistor ("FET"). In the most common circuit designs, one side of the transistor is connected to one side of the capacitor, the other side of the transistor and the transistor gate are connected to external circuit lines called the bitline and the wordline, and the other side of the capacitor is connected to a reference voltage that is typically ½ the internal circuit voltage. In such memory cells, an electrical signal charge is stored in a storage node of the capacitor connected to the transistor, which opens and closes to charge and discharge the circuit lines of the capacitor.

Higher performance, lower cost, increased miniaturization of components, and greater packaging density of integrated circuits are ongoing goals of the computer industry. The advantages of increased miniaturization of components include: reduced-bulk electronic equipment, improved reliability by reducing the number of solder or plug connections, lower assembly and packaging costs, and improved circuit performance. In pursuit of increased miniaturization, DRAM chips have been continually redesigned to achieve ever higher degrees of integration. However, as the dimensions of the DRAM chips are reduced, the occupation area of each unit memory cell of a DRAM chip must be reduced. This reduction in occupied area necessarily results in a reduction of the dimensions of the capacitor, which, in turn, makes it difficult to ensure required storage capacitance for transmitting a desired signal without malfunction. However, the ability to densely pack the unit memory cells while maintaining required capacitance levels is a crucial requirement of semiconductor manufacturing if future generations of DRAM chips are to be successfully manufactured.

In order to minimize such a decrease in storage capacitance caused by the reduced occupied area of the capacitor, the capacitor should have a relatively large surface area within the limited region defined on a semiconductor substrate. The drive to produce smaller DRAM circuits has given rise to a great deal of capacitor development. However, for reasons of available capacitance, reliability, and ease of fabrication, most capacitors are stacked capacitors in which the capacitor covers nearly the entire area of a cell and in which vertical portions of the capacitor contribute significantly to the total charge storage capacity. In such designs, the side of the capacitor connected to the transistor is generally called the "storage node" or "storage poly" since the material out of which it is formed is doped polysilicon, while the polysilicon layer defining the side of the capacitor connected to the reference voltage mentioned above is called the "cell poly".

Furthermore, a variety of methods are used for increasing the surface area of the capacitor. These methods include forming the capacitor with various three-dimensional shapes extending from the capacitor. Such shapes include fins, cylinders, and cubes, as well as forming rough or irregular surfaces on these shapes.

FIGS. 7–10 illustrate a prior art technique for forming a capacitor for a memory cell. FIG. 7 illustrates an intermediate structure 200 in the production of a memory cell. This intermediate structure 200 comprises a substrate 202, such as a lightly doped P-type crystal silicon substrate, which has been oxidized to form thick field oxide areas 204 and exposed to implantation processes to form drain regions 208 and a source region 210 of N+ doping. Transistor gate members 212 are formed on the surface of the substrate 202 and span between the drain regions 208 and source region 210. The transistor gate members 212 each comprise a thin gate oxide layer 206 separating a gate conducting layer or wordline 216 of the transistor gate member 212 from the substrate 202. Transistor insulating spacer members 218 are formed on either side of each transistor gate member 212. A lower insulating layer 220 is applied over the transistor gate members 212 and the substrate 202. After application, the lower insulating layer 220 is planarized.

The planarized lower insulating layer 220 is then masked and etched to form a channel therethrough to the source region 210. A bitline 222 is then formed to contact the source region 210 and extend to other source regions (not shown) on the planarized surface 224 of the planarized lower insulating layer 220. An upper insulating layer 226 is then applied over the lower insulating layer 220 and the bitlines 222. After application, the upper insulating layer 226 is planarized.

The planarized upper insulating layer 226 is then masked and etched to form channels through the upper insulating layer 226 and the lower insulating layer 220 to respective drain regions 208. A storage poly 228 is then deposited over the planarized upper insulating layer 226 such that the storage poly 228 extends through the channels to contact the drain regions 208.

As shown in FIG. 8, the storage poly 228 is then masked with a resist layer 230 and etched to separate the storage poly 228 into storage poly nodes 232 (shown in FIG. 9). A capacitor or cell dielectric 234 (shown in FIG. 10) is deposited over the storage poly nodes 232 and the upper insulating layer 226. A cell poly or plate electrode 236 is then disposed over the capacitor or cell dielectric 234 to form the capacitor 238 of each memory cell, as shown in FIG. 10.

If the surface area of the capacitor 238 needs to be increased, further processing steps would be required to form an irregular or rough surface on the storage poly nodes 232 prior to the addition of the capacitor or cell dielectric 234 and the cell poly or plate electrode 236.

U.S. Pat. No. 5,457,063 issued Oct. 10, 1995 to Park ("the Park patent") teaches a method of increasing the surface area of a capacitor. The Park patent illustrates a prior art method of first etching recesses in the polysilicon layer to form the storage poly nodes, then again etching the polysilicon layer to separate individual storage poly nodes. The Park patent teaches using the same prior art two-step method to form the storage poly nodes, but also forms polysilicon sidewalls to exploit the empty space around the periphery of the storage poly node. Although both the prior art method and the method of the Park patent increase the surface area of a capacitor, each require numerous processing steps to achieve this goal. The additional process steps result in increased production costs which, in turn, result in increased semiconductor chip costs.

Therefore, it would be advantageous to develop a technique for forming a high surface area capacitor, while using inexpensive, commercially available, widely practiced semiconductor device fabrication techniques and apparatus without requiring such additional processing steps.

SUMMARY OF THE INVENTION

The present invention is a one-step masking and etching technique utilized during each formation of a memory cell capacitor which simultaneously separates storage poly into individual storage poly nodes and which etches recesses into the storage poly node in order to increase the surface area of the storage poly node. The increase in the storage poly node surface area increases memory cell capacitance to an adequate degree without additional processing steps. Thus, the overall size of the storage poly node can be reduced while maintaining a predetermined capacitance, which feature ultimately results in higher density DRAMs.

The method of the present invention occurs after formation of an intermediate structure comprising transistor gates on a silicon substrate which has been oxidized to form thick field oxide areas and exposed to implantation processes to form drain and source regions. The intermediate structure further comprises a lower insulating layer which substantially covers the transistor gates and the silicon substrate. Bitlines are formed on the lower insulating layer and extend through the lower insulating layer to contact the silicon substrate source regions. The intermediate structure also includes an upper insulating layer covering the lower insulating layer and the bitlines. A storage poly layer covers the upper insulating layer and extends through the upper insulating layer and lower insulating layer to contact the silicon substrate drain regions, completing the intermediate structure.

The method of the present invention comprises simultaneously etching the storage poly to separate the storage poly into storage poly nodes and etching recesses into the storage poly nodes to increase the surface area of the storage poly nodes. The simultaneous etching is achieved with a mask or resist pattern which has apertures for separating the storage poly into storage poly nodes and at least one recess forming aperture positioned over each storage poly node. The size (i.e., width, diameter, or surface area) of the recess apertures should be less than the size (i.e., width, diameter, or surface area) of the separation apertures. With the recess apertures smaller than the separation apertures, the etching solution has a lower diffusion rate in the recess apertures than the separation apertures. Thus etching occurs more slowly in the recess apertures than the separation apertures. Therefore, when the etching step to separate the storage poly into storage poly nodes is complete, the etching in the recess apertures will merely create recesses in the storage poly rather than etching completely through. The recess apertures can be of any shape, size, and/or density to achieve a desired surface area of the storage poly nodes.

Once the storage poly node is etched, a capacitor or cell dielectric is deposited over the storage poly node and the upper insulating layer. A cell poly or plate electrode is then disposed over the capacitor dielectric to form the capacitor of each memory cell.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENTS

Figure 1:
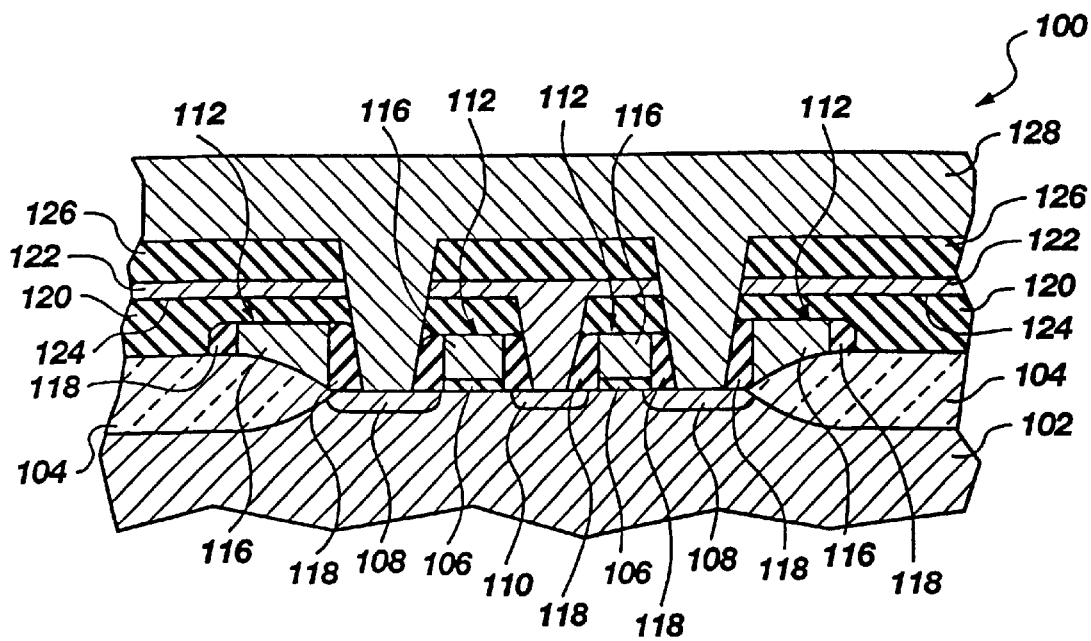
FIGS. 1–4 illustrate a method of fabricating a forked capacitor for a memory cell according to the present invention.

FIGS. 1–4 illustrate a technique for forming a forked capacitor for a memory cell. FIG. 1 illustrates an intermediate structure 100 in the production of a memory cell. This intermediate structure 100 comprises a semiconductor substrate 102, such as a lightly doped P-type crystal silicon substrate, which has been oxidized to form thick field oxide areas 104 and exposed to implantation processes to form drain regions 108 and a source region 110 of N+ doping. Transistor gate members 112 are formed on the surface of the semiconductor substrate 102 between the drain regions 108 and the source region 110. The transistor gate members 112 each comprise a patterned thin gate oxide layer 106 (preferably silicon dioxide) separating a gate conducting layer or wordline 116 of the transistor gate member 112 and the semiconductor substrate 102. Transistor insulating spacer members 118, preferably silicon dioxide, are formed on either side of each transistor gate member 112. A lower insulating layer 120 (such as boro-phospho-silicate glass—BPSG, silicon nitride, silicon dioxide, etc.) is applied over the transistor gate members 112 and the semiconductor substrate 102. After application, the lower insulating layer 120 is planarized, preferably by abrasion, such as with a CMP (chemical/mechanical polishing) process, as known in the art.

The planarized lower insulating layer 120 is then masked and etched to form a channel therethrough to the source region 110. A bitline 122 is then formed to contact the source region 110 and extend to other source regions (not shown) on the planarized surface 124 of the planarized lower insulating layer 120. An upper insulating layer 126 is then applied over the lower insulating layer 120 and the bitlines 122. After application, the upper insulating layer 126 is also planarized.

The planarized upper insulating layer 126 is then masked and etched, preferably utilizing a storage poly node photomask process as known in the art, to form channels through the upper insulating layer 126 and the lower insulating layer 120 to respective drain regions 108. A storage poly 128, such as doped silicon, is then deposited over the planarized upper insulating layer 126 such that the storage poly 128 extends through the channels to contact the drain regions 108.

Figure 2:
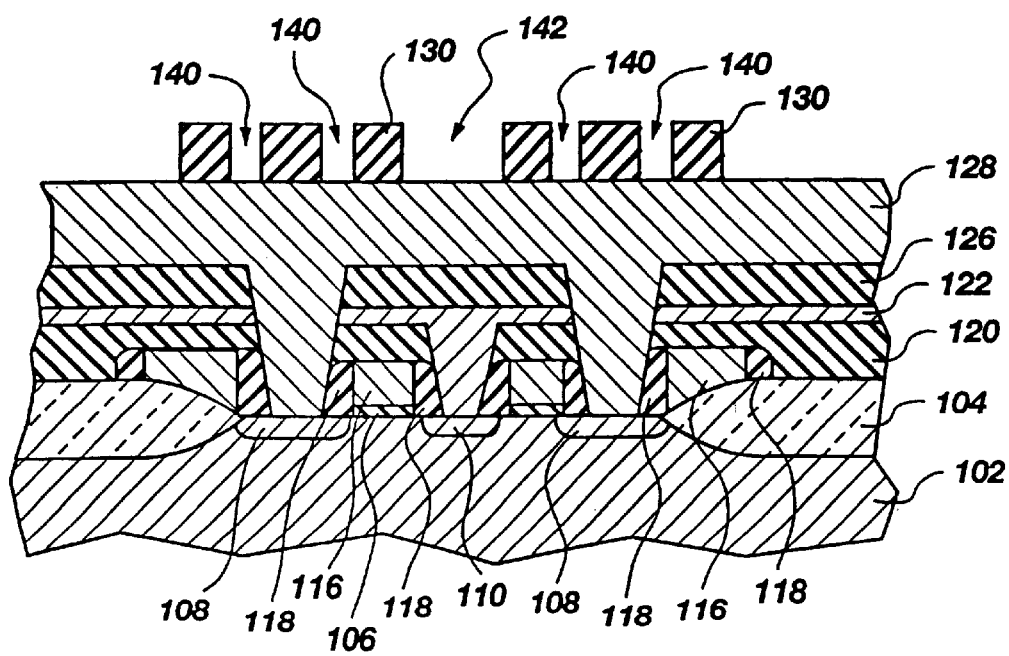
Figure 3:
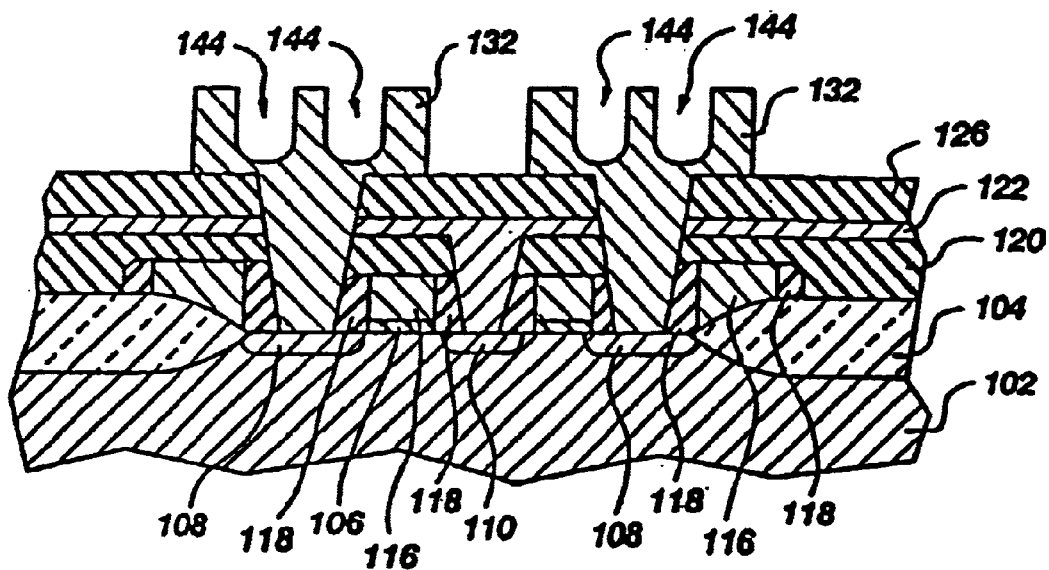

The storage poly 128 is masked and etched to separate the storage poly 128 into storage poly nodes 132 (FIG. 3). However, as shown in FIGS. 2 and 3, the present invention differs from previously known manufacturing techniques in that the mask 130 or resist used to separate the storage poly 128 into storage poly nodes 132 includes at least one aperture 140 positioned over the proposed or intended location of each storage poly node 132. The area of the apertures 140 should be less than the area of boundary openings 142 in the mask 130 for separating the storage poly 128 into storage poly nodes 132. With the apertures 140 being smaller than the boundary openings 142, the etching solution has a lower diffusion rate in the apertures 140 than in the boundary openings 142, thus the etching occurs more slowly in the apertures 140 than the boundary openings 142. Therefore, when the etching step conducted through boundary openings 142 to separate the storage poly 128 into storage poly nodes 132 is complete, the etching conducted through the apertures 140 will merely create recesses 144 in the storage poly 128 rather than etch completely therethrough. It is, of course, understood that the apertures 140 can be of any shape (circular, triangular, rectangular, etc.), size, and/or dimension to achieve a desired surface area on the storage poly nodes 132.

Figure 4:
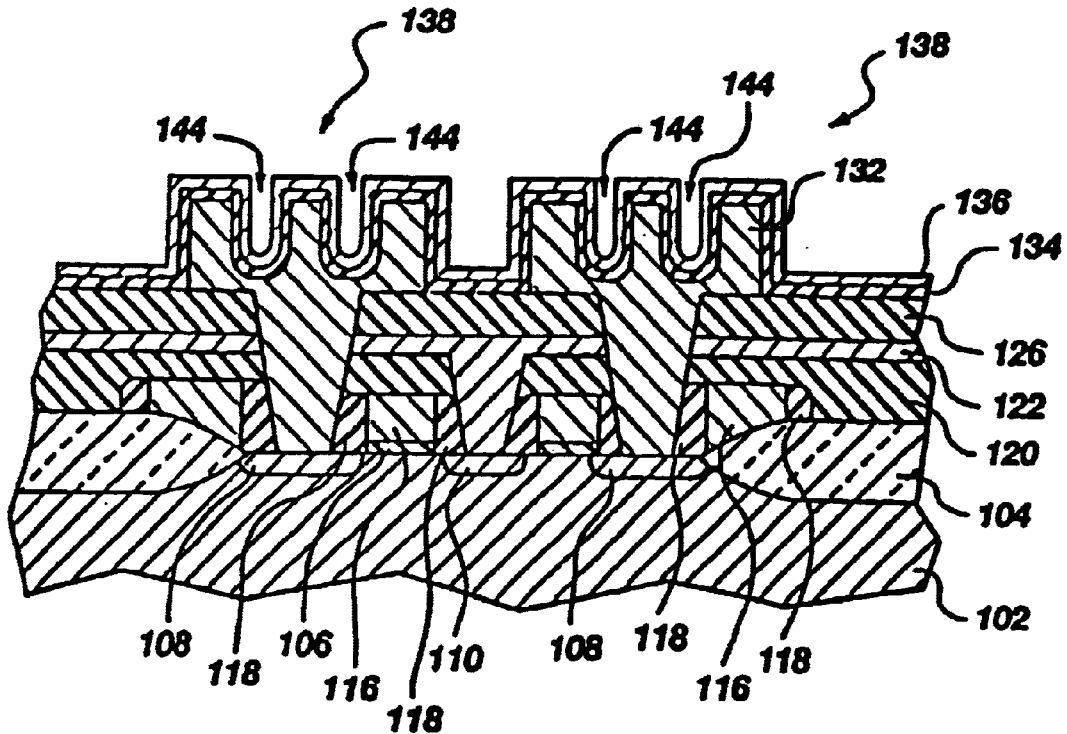

As shown in FIG. 4, a capacitor or cell dielectric 134, preferably silicon dioxide, silicon nitride or the like, is subsequently deposited over the storage poly nodes 132 and the upper insulating layer 126. A cell poly or plate electrode 136 is disposed over the capacitor or cell dielectric 134 to form the capacitor 138 of each memory cell.

The formation of the recesses 144 in the storage poly nodes 132 results in an increase in the surface area of the capacitor 138. This results in lower refresh rates, easier sensing of the contents of the cell due to a greater potential difference between bitlines, and a reduction in the pitch constraints on the layout of the memory cells due to smaller capacitors fabricated by the method of the present invention being able to achieve a predetermined capacitance.

Figure 5:
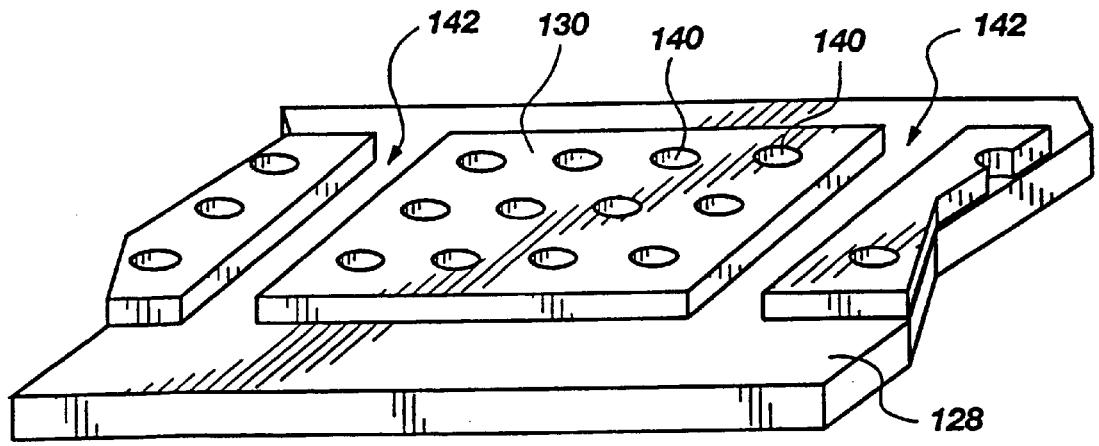
FIG. 5 illustrates an oblique view of an etching mask of the present invention.
Figure 6:
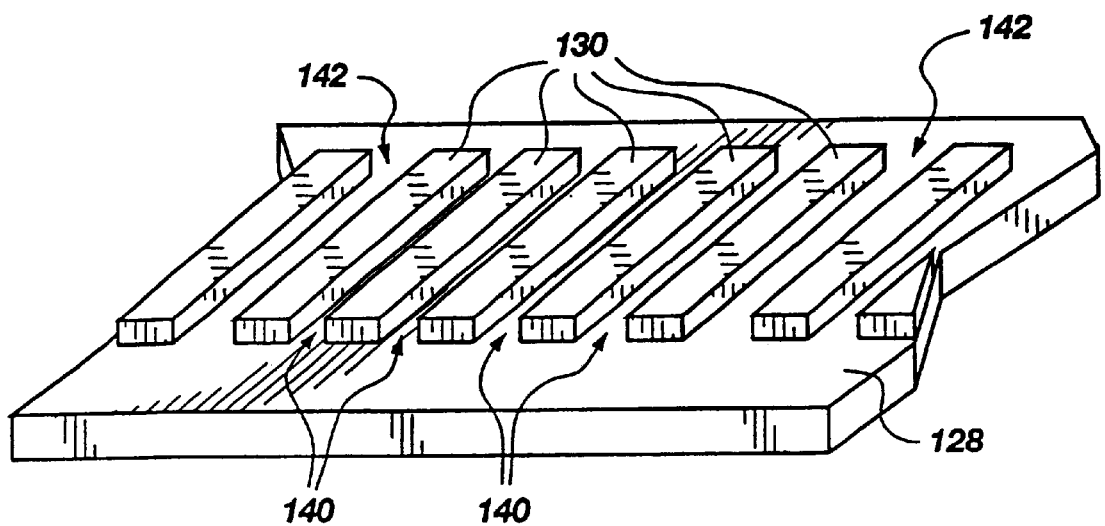
FIG. 6 illustrates an oblique view of another etching mask of the present invention.
Figure 7:
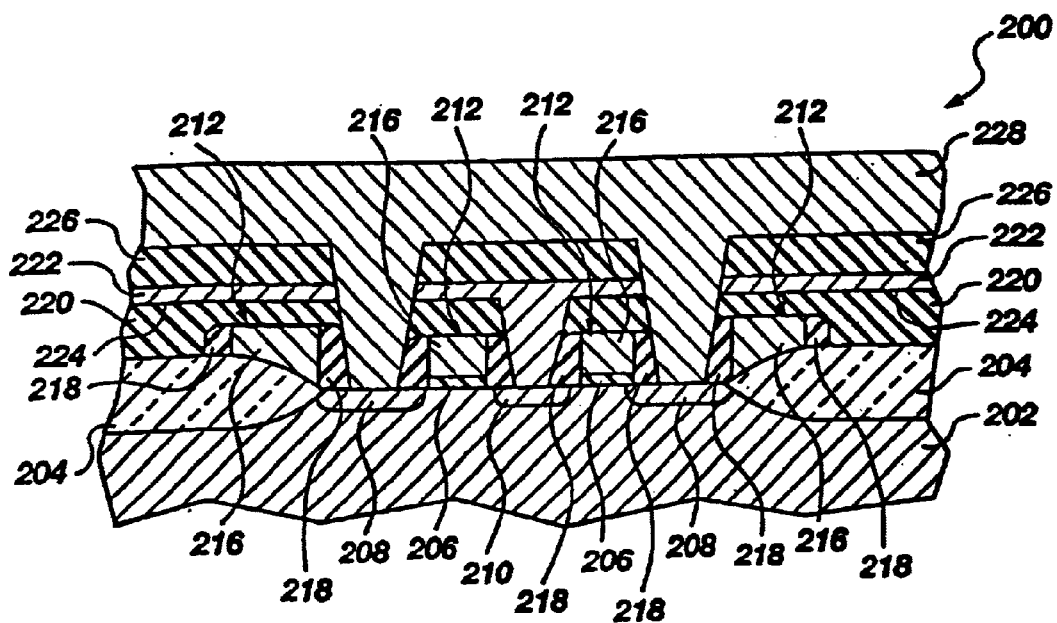
FIGS. 7–10 illustrate a prior art method of fabricating a capacitor for a memory cell.
Figure 8:
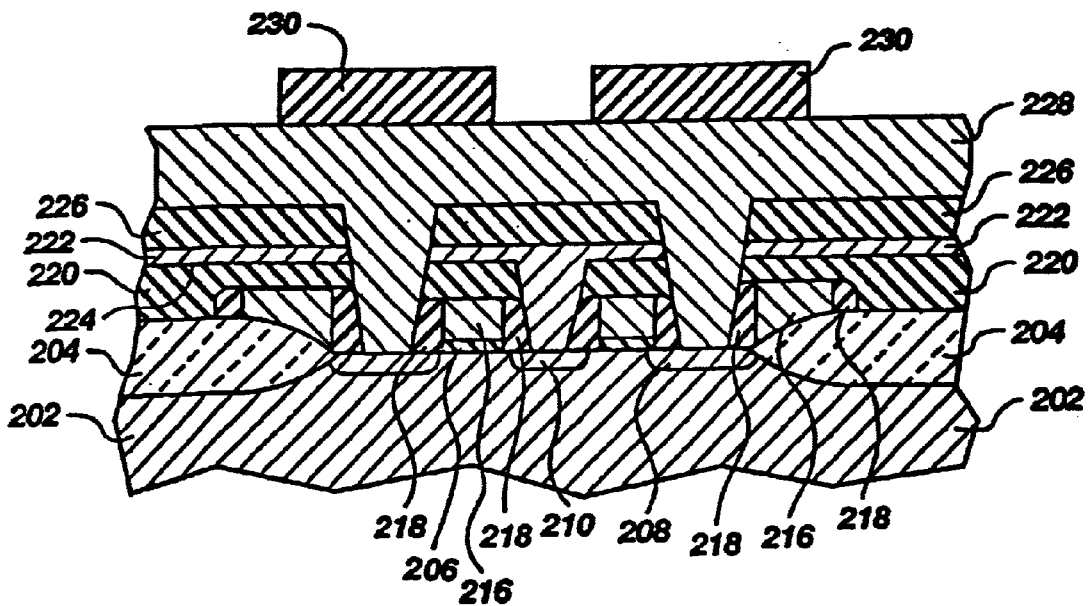
Figure 9:
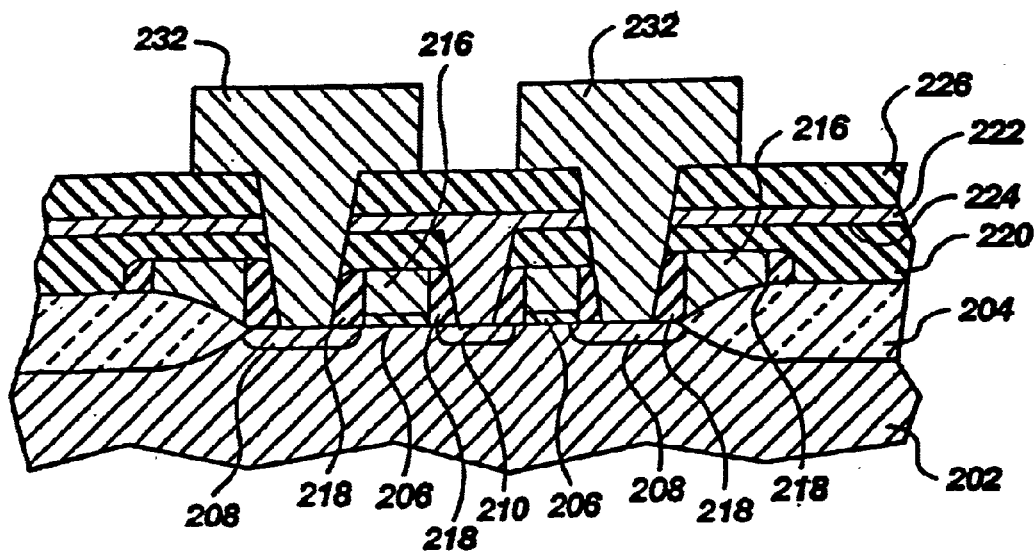
Figure 10:
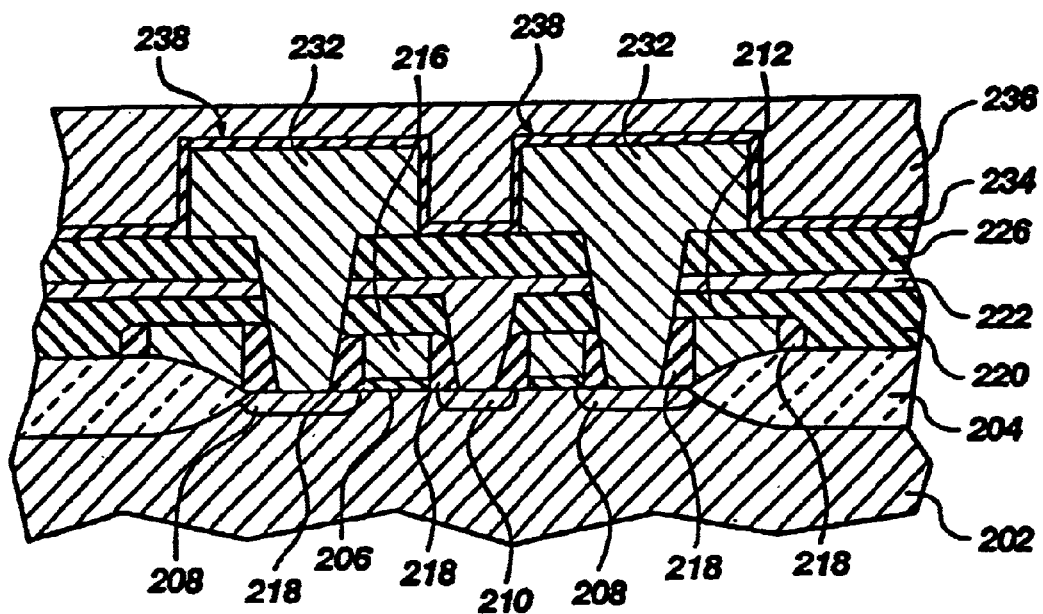

FIGS. 5 and 6 illustrate oblique views of two embodiments of the mask 130 as shown in FIG. 2. FIG. 5 illustrates an embodiment where the apertures 140 are holes through the mask 130 and the boundary openings 142 are avenues, wherein the diameter of the holes of the apertures 140 is smaller than the width of the avenues of the boundary openings 142. FIG. 6 illustrates an embodiment where both the apertures 140 and the boundary openings 142 in the mask 130 are avenues, wherein the avenues of the boundary openings 142 are wider than the avenues of the apertures 140.

This invention could also be used to fabricate decoupling and pump capacitors during the same processing steps as are used to form the cell capacitors of the array. This increase in capacitance would be advantageous for the decoupling and pump capacitors to save space on the die and potentially decrease the overall die size.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A memory cell comprising one of a plurality of laterally adjacent memory cells forming a memory array, the memory cell comprising:

a substrate;

a plurality of vertically upstanding storage poly node portions mutually separated by a plurality of recesses and disposed over the substrate, the storage poly node portions together forming a fork-like upper surface;

a capacitor dielectric layer disposed substantially conformally over the fork-like upper surface of the storage poly node portions; and a plate electrode layer extending substantially conformally over the fork-like upper surface of the storage poly node portions with the capacitor dielectric layer disposed therebetween, the storage poly node portions, the capacitor dielectric layer and the plate electrode layer together forming a fork-like structure so that an upper surface of the plate electrode layer substantially conformally mimics the fork-like upper surface of the plurality of vertically upstanding storage poly node portions, the plurality of vertically upstanding storage poly node portions of the memory cell being laterally spaced from storage poly node portions of any adjacent memory cells of the plurality of laterally adjacent memory cells forming the memory array by a peripheral boundary, wherein each recess of the plurality of recesses is of lesser lateral extent between the storage poly node portions of the memory cell than a smallest lateral distance from any storage poly node portion of the memory cell across the peripheral boundary to any storage poly node portion of any laterally adjacent memory cell of the plurality of laterally adjacent memory cells forming the memory array.

2. The memory cell of claim 1, wherein the substrate comprises at least one thick field oxide area, at least one implanted drain region and at least one implanted source region.

3. The memory cell of claim 2, wherein the substrate comprises at least one transistor gate member spanned between the at least one implanted drain region and the at least one implanted source region on an upper surface of the substrate.

4. The memory cell of claim 2, wherein the substrate comprises a bitline within at least one layer of insulative material, wherein the bitline is in electrical communication with the at least one implanted source region, and a storage poly layer on an upper surface of the at least one layer of insulative material wherein a portion of the storage poly layer extends through the at least one layer of insulative material to contact the at least one implanted drain region.

5. The memory cell of claim 1, wherein the capacitor dielectric layer comprises at least one of silicon dioxide and silicon nitride.

6. The memory cell of claim 1, wherein the plurality of vertically upstanding storage poly node portions disposed over the substrate comprise a doped silicon.

7. A capacitor for a memory cell comprising one of a plurality of laterally adjacent memory cells forming a memory array, the capacitor comprising:

a substrate;

a plurality of vertically upstanding storage poly node portions mutually separated by a plurality of recesses and disposed over the substrate, the storage poly node portions together forming a fork-like upper surface;

a capacitor dielectric layer disposed substantially conformally over the fork-like upper surface of the storage poly node portions; and a plate electrode layer extending substantially conformally over the fork-like upper surface of the storage poly node portions with the capacitor dielectric layer disposed therebetween, the storage poly node portions, the capacitor dielectric layer and the plate electrode layer together forming a fork-like structure so that an upper surface of the plate electrode layer substantially conformally mimics the fork-like upper surface of the plurality of vertically upstanding storage poly node portions, the plurality of vertically upstanding storage poly node portions of the capacitor being laterally spaced from storage poly node portions of capacitors of any adjacent memory cells of the plurality of laterally adjacent memory cells forming the memory array by a peripheral boundary, wherein each recess of the plurality of recesses is of lesser lateral extent between storage poly node portions of the capacitor than a smallest lateral distance from any storage poly node portion of the capacitor across the peripheral boundary to any storage poly node portion of the capacitor of any laterally adjacent memory cell of the plurality of laterally adjaent memory cells forming the memory array.

8. The capacitor of claim 7, wherein the substrate comprises at least one thick field oxide area, at least one implanted drain region and at least one implanted source region.

9. The capacitor of claim 8, wherein the substrate comprises at least one transistor gate member spanned between the at least one implanted drain region and the at least one implanted source region on an upper surface of the substrate.

10. The capacitor of claim 8, wherein the substrate comprises a bitline within at least one layer of insulative material, wherein the bitline is in electrical communication with the at least one implanted source region, and a storage poly layer on an upper surface of the at least one layer of insulative material wherein a portion of the storage poly layer extends through the at least one layer of insulative material to contact the at least one implanted drain region.

11. The capacitor of claim 7, wherein the capacitor dielectric layer comprises at least one of silicon dioxide and silicon nitride.

12. The capacitor of claim 7, wherein the plurality of vertically upstanding storage poly node portions disposed over the substrate comprise a doped silicon.

13. A storage poly node structure for a memory cell comprising one of a plurality of laterally adjacent memory cells forming a memory array, the storage poly node structure comprising:
 a substrate;
 a plurality of vertically upstanding storage poly node portions mutually separated by a plurality of recesses and disposed over the substrate, the storage poly node portions together forming a fork-like upper surface;
 a capacitor dielectric layer disposed substantially conformally over the fork-like upper surface of the storage poly node portions; and
 a plate electrode layer extending substantially conformally over the fork-like upper surface of the storage poly node portions with the capacitor dielectric layer disposed therebetween, the storage poly node portions, the capacitor dielectric layer and the plate electrode layer together forming a fork-like structure so that an upper surface of the plate electrode layer substantially comformally mimics the fork-like upper surface of the plurality of vertically upstanding storage poly node portions, the plurality of vertically upstanding storage poly node portions of the storage poly node structure being laterally spaced from storage poly node structures of any adjacent memory cells of the plurality of laterally adjacent memory cells forming the memory array by a peripheral boundary, wherein each of the plurality of recesses is of lesser lateral extent between storage poly node portions of the storage poly node structure than a smallest lateral distance from any storage poly node portion of the storage poly node structure across the peripheral boundary to any storage poly node portion of the storage poly node structure of any laterally adjacent memory cell of the plurality of laterally adjacent memory cells forming the memory array.

14. The storage poly node structure of claim 13, wherein the substrate comprises at least one thick field oxide area, at least one implanted drain region and at least one implanted source region.

15. The storage poly node structure of claim 14, wherein the substrate comprises at least one transistor gate member spanned between the at least one implanted drain region and the at least one implanted source region on an upper surface of the substrate.

16. The storage poly node structure of claim 14, wherein the substrate comprises a bitline within at least one layer of insulative material, wherein the bitline is in electrical communication with the at least one implanted source region, and a storage poly layer on an upper surface of the at least one layer of insulative material wherein a portion of the storage poly layer extends through the at least one layer of insulative material to contact the at least one implanted drain region.

17. The storage poly node structure of claim 13, wherein the capacitor dielectric layer comprises at least one of silicon dioxide and silicon nitride.

18. The storage poly node structure of claim 13, wherein the storage poly node portions disposed over the substrate comprise a doped silicon.

19. A semiconductor device assembly precursor for forming at least one memory cell from a storage poly layer overlying a semiconductor device, the semiconductor device assembly precursor comprising:
 an etch mask overlying the storage poly layer, the etch mask comprised of a single material layer and configured to form the at least one memory cell to have a fork-like poly node structure, the etch mask including at least one peripheral opening therethrough laterally bounding a location over the storage poly layer to form a periphery of the fork-like poly node structure for the at least one memory cell, and the etch mask further including at least one aperture therethrough formed proximate the at least one peripheral opening to form a defined location of at least one recess of the fork-like poly node structure, the at least one peripheral opening having a smallest width greater than a largest lateral dimension of the at least one aperture defining the location of the at least one recess of the fork-like poly node structure.

20. The semiconductor device assembly precursor of claim 19, wherein the at least one aperture comprises at least one elongated avenue.

21. The semiconductor device assembly precursor of claim 19, wherein the at least one aperture comprises a hole having a peripheral boundary location.

22. A memory cell comprising one of a plurality of laterally adjacent memory cells forming a memory array, the memory cell comprising:
 a substrate;
 a storage poly layer disposed over the substrate;
 a plurality of vertically upstanding storage poly node portions formed in the storage poly layer and mutually separated by at least one recess, the storage poly node portions together forming a fork-like upper surface and a lower surface, wherein at least a portion of the lower surface contacts the storage poly layer;

a capacitor dielectric layer disposed substantially conformally over the fork-like upper surface of the storage poly node portions; and a plate electrode layer extending substantially conformally over the fork-like upper surface of the storage poly node portions with the capacitor dielectric layer disposed therebetween, the storage poly node portions, the capacitor dielectric layer and the plate electrode layer together forming a fork-like structure so that an upper surface of the plate electrode layer substantially conformally mimics the fork-like upper surface of the plurality of vertically upstanding storage poly node portions, the plurality of vertically upstanding storage poly node portions of the memory cell being laterally spaced from storage poly node portions of any adjacent memory cells of the plurality of laterally adjacent memory cells forming the memory array by a peripheral boundary, wherein each at least one recess is of lesser lateral extent between the storage poly node portions of the memory cell than a smallest lateral distance from any storage poly node portion of the memory cell across the peripheral boundary to any storage poly node portion of any laterally adjacent memory cell of the plurality of laterally adjacent memory cells forming the memory array.

23. A capacitor for a memory cell comprising one of a plurality of laterally adjacent memory cells forming a memory array, the capacitor comprising:

a substrate;

a storage poly layer disposed over the substrate;

a plurality of vertically upstanding storage poly node portions formed in the storage poly layer and mutually separated by at least one recess, the storage poly node portions together forming a fork-like upper surface and a lower surface, wherein at least a portion of the lower surface contacts the storage poly layer;

a capacitor dielectric layer disposed substantially conformally over the fork-like upper surface of the storage poly node portions; and a plate electrode layer extending substantially conformally over the fork-like upper surface of the storage poly node portions with the capacitor dielectric layer disposed therebetween, the storage poly node portions, the capacitor dielectric layer and the plate electrode layer together forming a fork-like structure so that an upper surface of the plate electrode layer substantially conformally mimics the fork-like upper surface of the plurality of vertically upstanding storage poly node portions, the plurality of vertically upstanding storage poly node portions of the capacitor being laterally spaced from storage poly node portions of capacitors of any adjacent memory cells of the plurality of laterally adjacent memory cells forming the memory array by a peripheral boundary, wherein each at least one recess is of lesser lateral extent between storage poly node portions of the capacitor than a smallest lateral distance from any storage poly node portion of the capacitor across the peripheral boundary to any storage poly node portion of the capacitor of any laterally adjacent memory cell of the plurality of laterally adjacent memory cells forming the memory array.

24. A storage poly node structure for a memory cell comprising one of a plurality of laterally adjacent memory cells forming a memory array, the storage poly node structure comprising:

a substrate;

a storage poly layer disposed over the substrate;

a plurality of vertically upstanding storage poly node portions formed in the storage poly layer and mutually separated by at least one recess, the storage poly node portions together forming a fork-like upper surface and a lower surface, wherein at least a portion of the lower surface contacts the storage poly layer;

a capacitor dielectric layer disposed substantially conformally over the fork-like upper surface of the storage poly node portions; and a plate electrode layer extending substantially conformally over the fork-like upper surface of the storage poly node portions with the capacitor dielectric layer disposed therebetween, the storage poly node portions, the capacitor dielectric layer and the plate electrode layer together forming a fork-like structure so that an upper surface of the plate electrode layer substantially conformally mimics the fork-like upper surface of the plurality of vertically upstanding storage poly node portions, the plurality of vertically upstanding storage poly node portions of the storage poly node structure being laterally spaced from storage poly node structures of capacitors of any adjacent memory cells of the plurality of laterally adjacent memory cells forming the memory array by a peripheral boundary, wherein each at least one recess is of lesser lateral extent between storage poly node portions of the storage poly node structure than a smallest lateral distance from any storage poly node portion of the storage poly node structure across the peripheral boundary to any storage poly node portion of the storage poly node structure of any laterally adjacent memory cell of the plurality of laterally adjacent memory cells forming the memory array.

* * * * *